United States Patent
Darmawikarta et al.

(10) Patent No.: US 11,322,444 B2
(45) Date of Patent: May 3, 2022

(54) LITHOGRAPHIC CAVITY FORMATION TO ENABLE EMIB BUMP PITCH SCALING

(71) Applicant: Intel Corporation, Santa Clara, CA (US)

(72) Inventors: Kristof Darmawikarta, Chandler, AZ (US); Hiroki Tanaka, Chandler, AZ (US); Robert May, Chandler, AZ (US); Sameer Paital, Chandler, AZ (US); Bai Nie, Chandler, AZ (US); Jesse Jones, Chandler, AZ (US); Chung Kwang Christopher Tan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 893 days.

(21) Appl. No.: 15/934,343

(22) Filed: Mar. 23, 2018

(65) Prior Publication Data
US 2019/0295951 A1 Sep. 26, 2019

(51) Int. Cl.
| | |
|---|---|
| *H01L 23/538* | (2006.01) |
| *H01L 23/522* | (2006.01) |
| *H01L 23/00* | (2006.01) |
| *H01L 25/00* | (2006.01) |
| *H01L 21/48* | (2006.01) |
| *H01L 25/065* | (2006.01) |

(52) U.S. Cl.
CPC ........ *H01L 23/538* (2013.01); *H01L 23/5226* (2013.01); *H01L 23/5381* (2013.01); *H01L 24/82* (2013.01); *H01L 2224/12105* (2013.01)

(58) Field of Classification Search
CPC ... H01L 23/538; H01L 23/5381; H01L 24/82; H01L 23/5226; H01L 2224/12105; H01L 25/50; H01L 2224/16238; H01L 24/16; H01L 25/0655; H01L 23/5384; H01L 21/4846; H01L 23/5385; H01L 2924/381
See application file for complete search history.

(56) References Cited

U.S. PATENT DOCUMENTS

| | | | | |
|---|---|---|---|---|
| 2014/0264791 A1* | 9/2014 | Manusharow | ...... | H01L 25/0655 257/666 |
| 2018/0040548 A1* | 2/2018 | Kim | ..................... | H01L 23/5383 |

FOREIGN PATENT DOCUMENTS

WO WO-2017111950 A1 * 6/2017 ............. H01L 25/50

* cited by examiner

*Primary Examiner* — Sonya McCall-Shepard
(74) *Attorney, Agent, or Firm* — Schwabe, Williamson & Wyatt, P.C.

(57) ABSTRACT

Embodiments include an electronic package with an embedded multi-interconnect bridge (EMIB) and methods of making such packages. Embodiments include a first layer, that is an organic material and a second layer disposed over the first layer. In an embodiment, a cavity is formed through the second layer to expose a first surface of the first layer. A bridge substrate is in the cavity and is supported by the first surface of the first layer. Embodiments include a first die over the second layer that is electrically coupled to a first contact on the bridge substrate, and a second die over the second layer that is electrically coupled to a second contact on the bridge substrate. In an embodiment the first die is electrically coupled to the second die by the bridge substrate.

16 Claims, 14 Drawing Sheets

LITHOGRAPHIC CAVITY FORMATION TO ENABLE EMIB BUMP PITCH SCALING

TECHNICAL FIELD

Embodiments of the present disclosure relate electronics packaging, and more particularly, to embedded multi-interconnect bridge (EMIB) technology with lithographically formed cavities.

BACKGROUND

Embedded multi interconnect bridge (EMIB) technology is primarily used in logic die to memory die (e.g., high bandwidth memory (HBM)) connections. EMIB employs a silicon piece that hosts ultrafine line-space (e.g., 2-2 µm) structures, that can be fabricated with silicon back end of line technology, but out of the organic substrate manufacturing capability. One or multiple of these silicon pieces are embedded inside a cavity that is skived in a standard organic substrate and connections are made to 'bridge' the fine bump pitch areas between the dies (e.g. 55 µm bump pitch).

As technology continues to advance, bump pitch scaling is projected to go down to 30 µm or lower, while maintaining bump thickness variation lower than 10 µm for assembly interaction. Unfortunately, multi-layer organic substrates can have thickness variation of over 40 µm even before reaching the final layer. Accordingly, the thickness of organic material layers that a laser needs to skive is not uniform. Variation of organic layer thickness within lot and even within panel is difficult to predict. As such, there is a higher chance of laser punch through (over-drilling) that damages underlying copper pads. Additionally, cavity dimensional and location tolerances with respect to the adjacent structures must be improved in cases where smaller silicon bridges are used.

EMBODIMENTS OF THE PRESENT DISCLOSURE

Figure 1A:
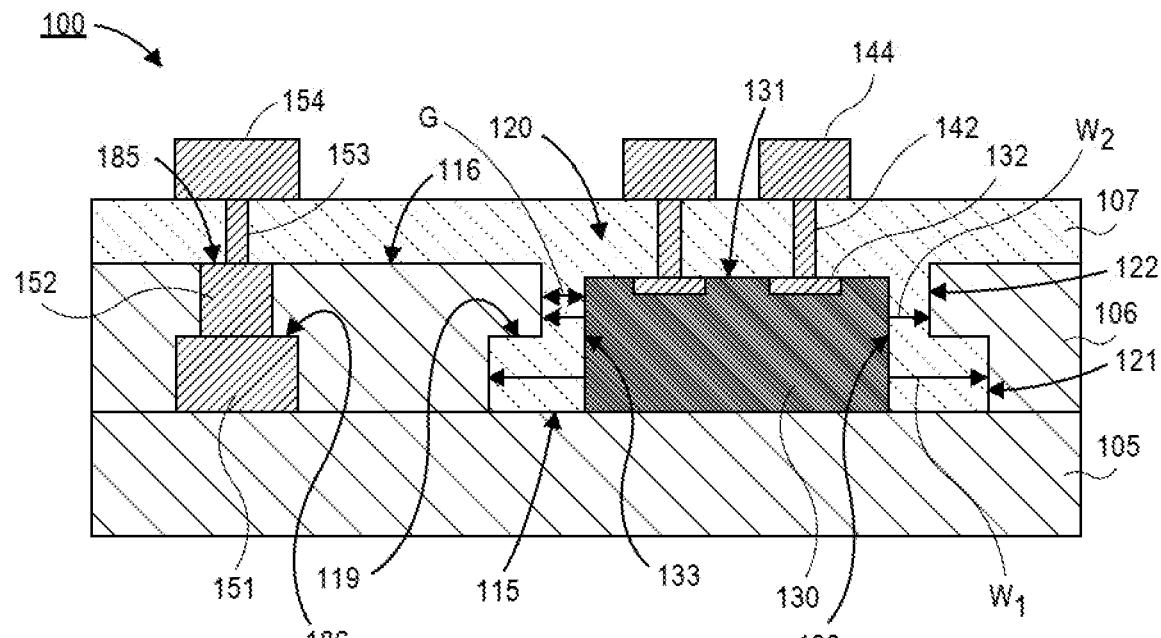
FIG. 1A is a cross-sectional illustration of an embedded bridge substrate in a cavity with a first portion with a first width and a second portion with a second width, in accordance with an embodiment.

Described herein are systems with embedded bridge substrates and methods of forming such systems. More particularly, embodiments include bridge substrates located in lithographically defined cavities and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Current available solutions for forming cavities for EMIB rely on existing process flows and toolsets that may soon reach a limit. For example, cavity skiving is done with a trepanning method where individual laser shots are overlapped to ablate the dielectric. This is done via the movement of the galvanometer, which incur misalignment error between each shot. Additionally, the pitch between shots cannot be infinitesimally small, thus creating a wave-like perimeter. Further, due to overlap of individual laser pulse during the trepanning process, locations with maximum laser spot overlap will have a predominant thermal impact and may be more prone to copper pad delamination as compared to locations with lower percentage laser spot overlap.

Accordingly, embodiments include forming the cavities with a lithographic processes. Defining the cavities with lithography improves the dimensional and positional tolerances, because the cavity is patterned by the same chrome mask that defines the rest of the conductive features. In embodiments, the lithographic process includes forming sacrificial conductive layers that may then be etched away to create a cavity in the substrate layer. As such, there is no risk of copper punch through. Furthermore, the formation of the sacrificial layers may be implemented in conjunction with the formation of lithographically defined vias. Since the sacrificial layers are formed during the formation of other features in the package, the complexity of the process is not significantly increased. In embodiments, the etching of the sacrificial material allows for more precise control of the dimension and location of the cavity. In some embodiments, the tolerance of the dimensions and location of the cavity may be reduced to +/−3 µm and will have a near perfect true position between features on the same mask.

Referring now to FIG. 1A, a cross-sectional illustration of an embedded multi-interconnect bridge (EMIB) 100 is shown, in accordance with an embodiment. In an embodiment the EMIB 100 may include a first layer 105. The first layer 105 may be an organic material, such as a build-up material typically used for electronic packages. A second layer 106 may be formed over the first layer 105. In an embodiment, the second layer 106 may be the same material as the first layer 105.

In an embodiment, a first conductive layer 151 may be formed over a top surface 115 of the first layer 105. The first conductive layer 151 may include pads and traces. In an embodiment, a second conductive layer 152 may be formed over the first conductive layer 151. The second conductive layer 152 may include a pillar. Embodiments may include a second conductive layer 152 that has substantially vertical sidewalls. As used herein, substantially vertical may refer to a surface that is +/−5° from perpendicular to an underlying surface. In an embodiment, the vertical sidewalls of the second conductive layer 152 may be obtained with the use of lithographic patterning.

In an embodiment, a cavity 120 may be formed in the second layer 106. The cavity 120 may be formed through the second layer 106. For example, the cavity 120 may expose a surface 115 of the first layer 105. In an embodiment, the cavity may include a first portion 121 and a second portion 122 formed above the first portion 121. In an embodiment, the first portion 121 may have a width $W_1$ that is greater than a width $W_2$ of the second portion. In an embodiment, the difference between width $W_1$ and width $W_2$ may be approximately 50 µm or less. In an embodiment, the difference between width $W_1$ and width $W_2$ may be approximately 10 µm or less. The width $W_2$ may be sufficient to allow a bridge substrate 130 to be inserted into the opening formed by the cavity 120. For example, the width $W_2$ may be approximately 10 mm, though embodiments include width $W_2$ of any dimension in order to accommodate a bridge substrate 130. In an embodiment, a gap G between the sidewall 133 of the bridge substrate 130 and the sidewall surface of the second portion 122 of the cavity 120 may be 100 µm or less. In an embodiment, the gap G may be 50 µm or less. In an embodiment, the gap G may be 20 µm or less. In an embodiment, the gap G may be sufficiently large to allow for the remaining portion of the cavity 120 to be filled with material from the third layer 107.

The difference in the widths $W_1$ and $W_2$ may result in an overhang. In an embodiment, a surface of the overhang 119 may be substantially coplanar with a surface 186 of the first conductive layer 151. As used herein, substantially coplanar may refer to surfaces that are within +/−3 µm of each other in the Z-direction. The overhang 119 and the surface 186 of the first conductive layer 151 being substantially coplanar may be a result of the processing methods used to form the EMIB 100. For example, the first portion 121 of the cavity 120 may be formed by removing a first sacrificial block (not shown) that is formed at the same time as the first conductive layer 151. Similarly, a top surface 116 of the second layer 106 may be substantially coplanar with a top surface 185 of the pillar 152. As will be described in greater detail below, the second portion 122 of the cavity 120 may be formed by removing a second sacrificial block (not shown) that is formed at the same time as the second conductive layer 152. In an embodiment, sidewalls of the first portion 121 and the second portion 122 of the cavity 120 may be substantially vertical due to the photolithography process used to form the sacrificial blocks.

In an embodiment, the bridge substrate 130 may be mounted in the cavity 120. The bridge substrate 130 may be supported by the surface 115 of the first substrate 105. In some embodiments, the bridge substrate 130 may be secured to the surface 115 of the first substrate 105 with an adhesive, such as a die bond film (DBF). In an embodiment, the thickness of the bridge substrate 130 may be less than the thickness of the second substrate 106. As such, the bridge substrate 130 may have a top surface 131 that is below the top surface 116 of the second layer 106. However, additional embodiments may include a bridge substrate 130 with a top surface 131 that is coplanar with the surface 116 or even above the top surface 116 of the second layer 106.

In an embodiment, the bridge substrate 130 may be a suitable material for forming features with line/spacing of 10/10 µm or less. In an embodiment, the line/spacing may be 2/2 µm or less. In an embodiment, the bridge substrate 130 may be a silicon substrate. As shown in FIG. 1A, the bridge substrate 130 may include a plurality of contact pads 132. Pairs of contact pads 132 may be electrically coupled to each other with finely spaced traces (not shown). As such, connections between dies (not shown) may with fine pitch bump regions may be bridged through the use of the bridge substrate 130.

In an embodiment, a third layer 107 may be formed over the second layer 106 and over the bridge substrate 130. The third layer 107 may fill the cavity 120. In embodiments, the third layer 107 may conform to the sidewalls of the first portion 121 and the second portion 122 of the cavity. The third layer 107 may also surround and fully embed the bridge substrate 130. Accordingly, the third layer 107 may contact sidewalls 133 and the top surface 131 of the bridge substrate 130. In an embodiment, vias 142 through a portion of the third layer 107 may connect fine pitch pads 144 to the contacts 132 on the bridge substrate. Vias 153 may also be formed through portions of the third layer 107 in order to provide an electrical connection to the second conductive layer 152 and the first conductive layer 151.

It is to be appreciated that the formation of the overhang 119 may decrease the reliability of the EMIB 100 in some situations where the cavity 120 is not able to be fully filled. Accordingly, embodiments may also include a cavity that is formed without an overhang. Such embodiments may increase the reliability of the device, but it may also be at the expense of a looser design rule on the conductive layers. The looser design rules for the conductive layers may be attributable to a self-align lithography process used to form the conductive layers. Such methods utilize a thick photoresist to support two plating steps (as will be described in greater detail below). There is a trade-off between thickness and resolution of a photoresist. As such, a larger critical dimension is expected a cavity 120 with no overhang 119.

Figure 1B:
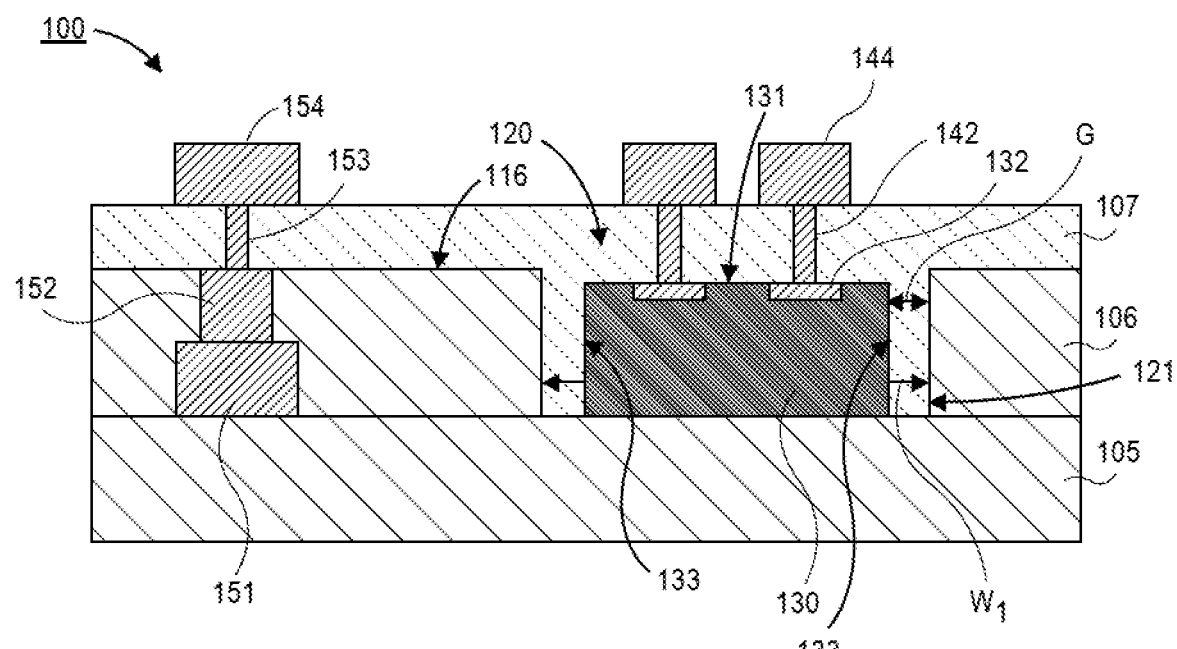
FIG. 1B is a cross-sectional illustration of an embedded bridge substrate in a cavity with a uniform width, in accordance with an embodiment.

Referring now to FIG. 1B, a cross-sectional illustration of an EMIB 100 with a cavity 120 with no overhang is shown, in accordance with an embodiment. The EMIB 100 is substantially similar to the EMIB 100 described with respect to FIG. 1A, with the exception that the cavity 120 only has a first portion 121 instead of a first portion 121 and a second portion 122. In an embodiment, the cavity 120 may be referred to as having a uniform width $W_1$. While the cavity 120 has a uniform width $W_1$, it is to be appreciated that the cavity 120 is still formed with sacrificial blocks formed with two metal deposition processes, as will be described in greater detail below. In an embodiment, sidewalls of the cavity 120 may be substantially vertical due to the photolithography process used to form the sacrificial blocks.

It is to be appreciated that there may be some architectures where the bridge substrate has a height that is greater than the thickness of the second layer. In such embodiments, the depth of the cavity may be increased by forming a plurality of layers. Examples of such embodiments are shown in FIGS. 2A and 2B.

Figure 2A:
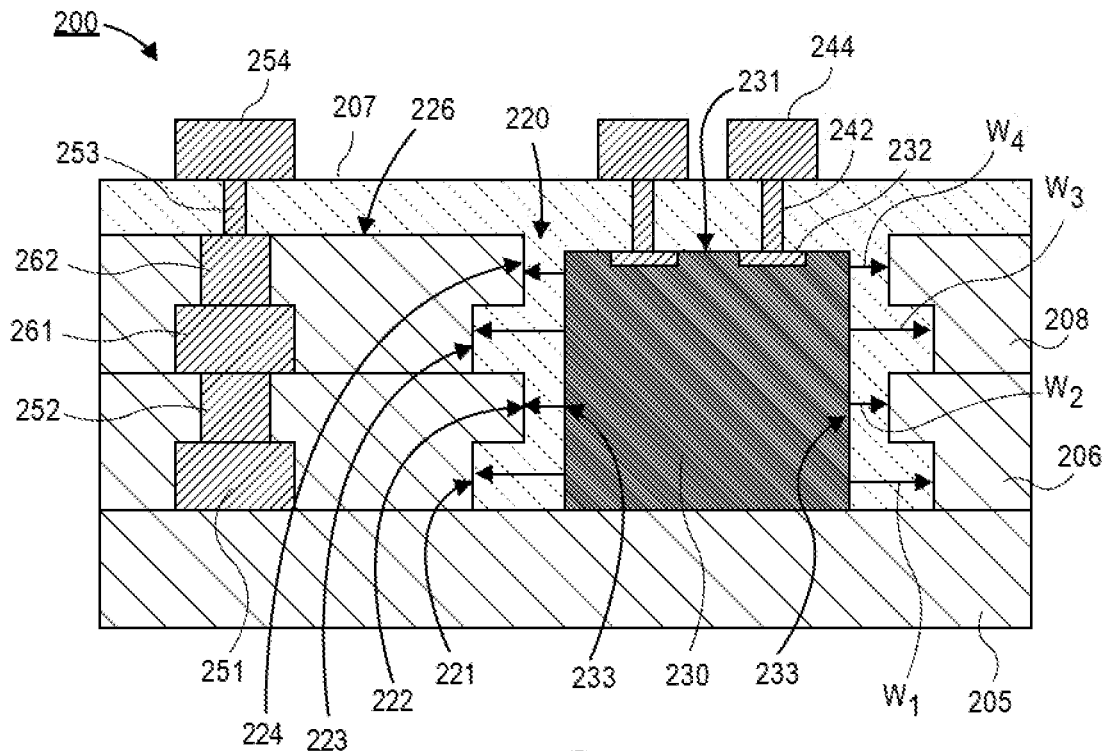
FIG. 2A is a cross-sectional illustration of an embedded bridge substrate in a cavity through more than one layer where each layer includes a first portion with a first width and a second portion with a second width, in accordance with an embodiment.
Figure 2B:
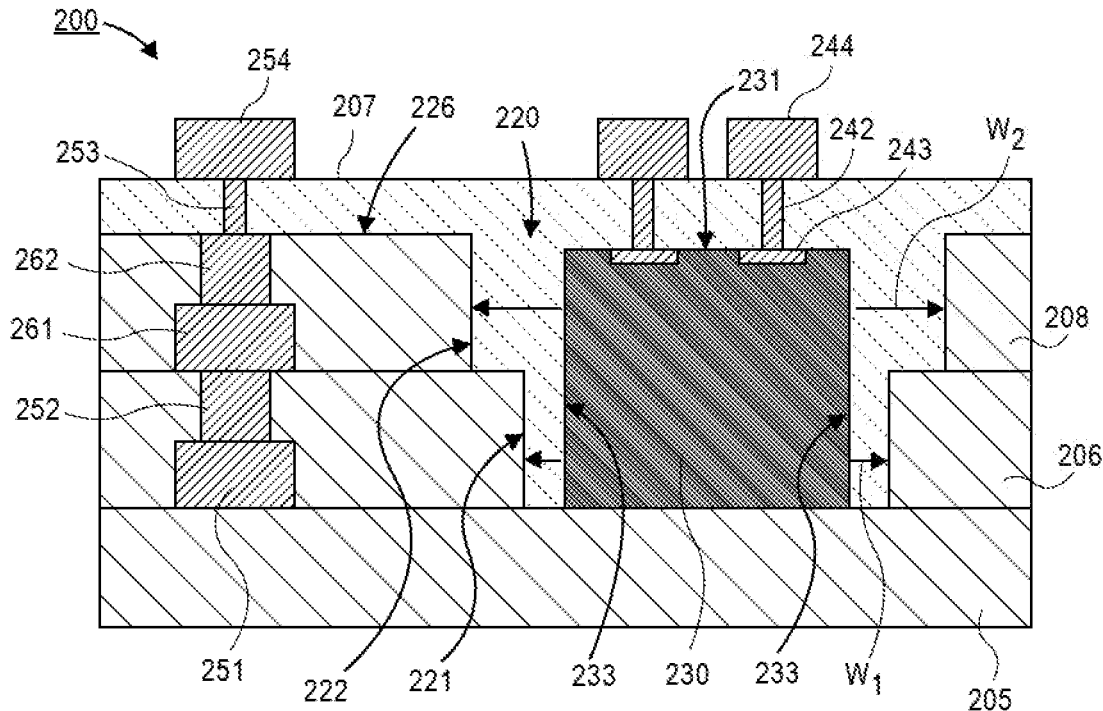
FIG. 2B is a cross-sectional illustration of an embedded bridge substrate in a cavity through more than one layer where a first layer has a width that is less than a width of the second layer.

Referring now to FIG. 2A, a cross-sectional illustration of an EMIB 200 with a cavity 220 formed through a plurality of layers is shown, in accordance with an embodiment. The EMIB 200 is substantially similar to the EMIB 100 described in FIG. 1A with the exception that the cavity is formed through a second layer 206 and a fourth layer 208.

The fourth layer 208 may be formed over the top surface of the second layer 206. In an embodiment, the cavity 220 may include a first portion 221, a second portion 222, a third portion 223, and fourth portion 224. The first portion 221 and the second portion 222 may be formed in the second layer 206, and the fourth portion 223 and the third portion 224 may be formed in the fourth layer 208. While four portions 221-224 are illustrated, it is to be appreciated that a cavity may be formed with any number of portions formed through any number of layers in order to provide a cavity 220 with a desired depth.

In an embodiment, the second portion 222 may form an overhang over the first portion 221, similar to the cavity 120 described above with respect to FIG. 1A. Similarly, the fourth portion 224 may form an overhang over the third portion 223. In an embodiment, the first portion 221 may have a first width $W_1$, the second portion 222 may have a second width $W_2$, the third portion 223 may have a third width W3, and the fourth portion 224 may have a fourth width W4. In some embodiments the first width $W_1$ and the third width W3 may be substantially the same, and the second width $W_2$ and the fourth width W4 may be substantially the same. In other embodiments, the first width $W_1$ and the third width W3 may not be substantially the same, and the second width $W_2$ and the fourth width W4 may not be substantially the same.

In the illustrated embodiment, the sidewalls of the first portion 221 are substantially aligned with sidewalls of the third portion 223, and sidewalls of the second portion 222 are substantially aligned with the sidewalls of the fourth portion 224. However, it is to be appreciated that misalignments due to the lithography process may result in sidewalls of the first portion 221 and the third portion 223 not being perfectly aligned or sidewalls of the second portion 222 and the fourth portion 224 not being perfectly aligned. In an embodiment, sidewalls of the first portion 221, the second portion 222, the third portion 223, and the fourth portion 224 of the cavity 220 may be substantially vertical due to the photolithography process used to form the sacrificial blocks. In an embodiment, third conductive layer 261 and fourth conductive layer 262 may also be formed through the fourth layer 208. The third conductive layer 261 and the fourth conductive layer 262 may electrically coupe the second conductive layer 251 to the via 253.

Referring now to FIG. 2B, a cross-sectional illustration of an EMIB 200 with a cavity 220 formed through a plurality of layers is shown, in accordance with an embodiment. The EMIB 200 is substantially similar to the EMIB 100 described with respect to FIG. 1B, with the exception that the cavity is formed through the second layer 206 and a fourth layer 208.

In an embodiment, the cavity 200 may include a first portion 221 and a second portion 222. The first portion 221 may be formed entirely in the second layer 206 and the second portion 222 may be formed entirely in the fourth layer 208. The first portion 221 may have a first width $W_1$ and the second portion 222 may have a second width $W_2$. In an embodiment, the second width $W_2$ may be greater than the first width $W_1$. While two portions 221 and 222 are illustrated, it is to be appreciated that a cavity may be formed with any number of portions formed through any number of layers in order to provide a cavity 220 with a desired depth. In an embodiment, sidewalls of the first portion 221 and the second portion 222 of the cavity 220 may be substantially vertical due to the photolithography process used to form the sacrificial blocks. In an embodiment, third conductive layer 261 and fourth conductive layer 262 may also be formed through the fourth layer 208. The third conductive layer 261 and the fourth conductive layer 262 may electrically coupe the second conductive layer 251 to the via 253.

The EMIBs described above may be used to bridge dies together. Examples of packages that include an EMIBs such as those described herein are illustrated in FIGS. 3A and 3B.

Figure 3A:
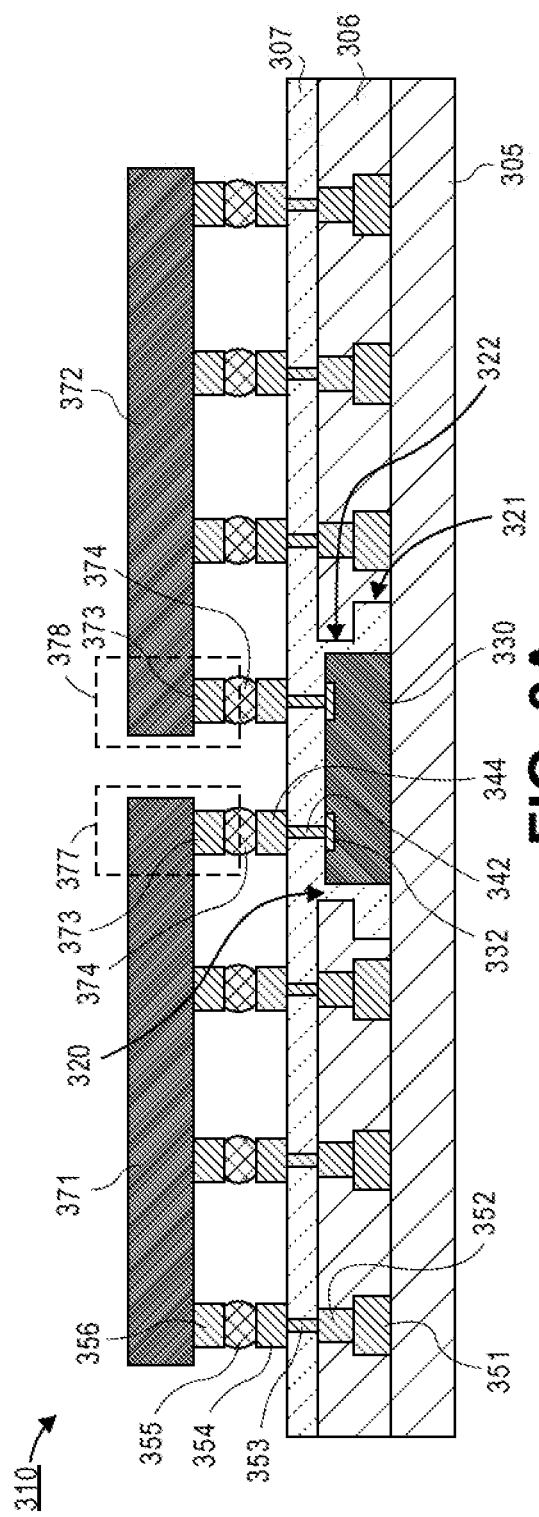
FIG. 3A is a cross-sectional illustration of a package with an embedded bridge that electrically couples a first die and a second die where a cavity has a first portion with a first width and a second portion with a second width, in accordance with an embodiment.
Figure 3B:
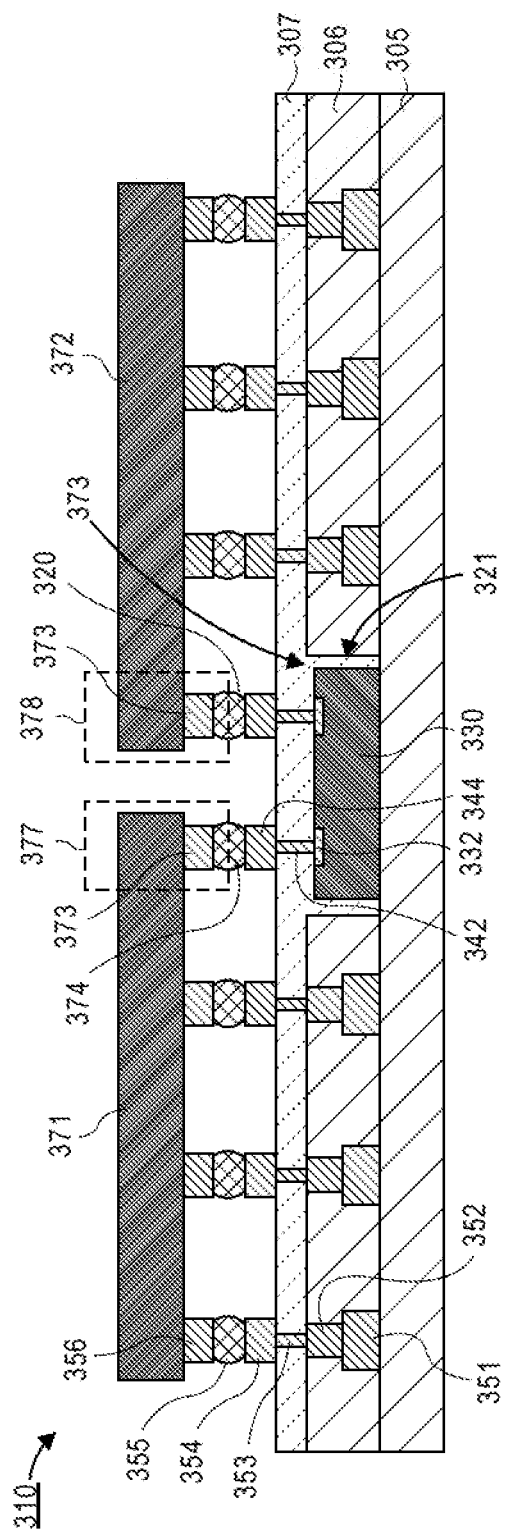
FIG. 3B is a cross-sectional illustration of a package with an embedded bridge that electrically couples a first die and a second die where a cavity has a uniform width, in accordance with an embodiment.

Referring now to FIG. 3A, a cross-sectional illustration of an electronics package 310 that includes an EMIB is shown, in accordance with an embodiment. In an embodiment, the package 310 may include a first die 371 and a second die 372. In an embodiment, the first die 371 may be a logic die and the second die 372 may be a memory die. The first die 371 and the second die 372 may be electrically coupled to conductive layers (e.g., the first and second conductive layers 351 and 352 and vias 353) by solder bumps 355 formed over contacts 354. The first and second die 371 and 372 may be electrically coupled to the solder bumps 355 by contacts 356.

In an embodiment, the first die 371 and the second die 372 may each include a fine bump pitch region 377 and 378, respectively. The fine bump pitch regions may be electrically coupled to contacts 332 of the bridge substrate 330. In an embodiment, the fine bump pitch regions 377 and 378 may have bumps 374 that have a pitch less than 55 μm. In additional embodiments, the fine bump pitch regions 377 and 378 may have a pitch less than 30 μm. The fine pitch regions 377 and 378 may be utilize for communicatively coupling the two dies together.

In order to provide electrical connections to communicatively couple the two dies together a bridge substrate 330 may be used. In an embodiment, the bridge substrate 330 is mounted in a cavity 320. The cavity 320 may include a first portion 321 and a second portion 322. The second portion 322 may form an overhang over the first portion 321. In an embodiment, the cavity 320 may be substantially similar to the cavity 120 described with respect to FIG. 1A. In an embodiment, a first die 371 and a second die 372 are electrically coupled to contacts 332 on the bridge substrate. The contacts 332 may be electrically coupled to each other with traces (not shown) formed on the bridge substrate 320. In an embodiment, the line/spacing of traces on the bridge substrate 320 may be 5/5 μm or less. In another embodiment, the line/spacing of traces on the bridge substrate 320 may be 2/2 μm or less.

Referring now to FIG. 3B, a cross-sectional illustration of an electronics package 310 that includes an EMIB is shown, in accordance with an additional embodiment. The electronics package 310 is substantially similar to the package in FIG. 3A with the exception of the cavity 320 not having an overhang. In an embodiment, the cavity 320 may include a single portion 321 formed through the second layer 306. The cavity 320 may be substantially similar to the cavity described with respect to FIG. 1B.

In FIGS. 3A and 3B, the cavities 320 are shown as being formed through a single layer (i.e., the second layer 306). However, it is to be appreciated that the cavity may be formed through any number of layers. For example, the cavity may be substantially similar to cavities 220 described with respect to FIGS. 2A and 2B in order to account for thicker bridge substrates.

Figure 4A:
FIG. 4A is a cross-sectional illustration of a first layer, in accordance with an embodiment.

Referring now to FIGS. 4A-4K, a series of cross-sectional illustrations showing a process for forming an EMIB is shown, in accordance with an embodiment. Referring now to FIG. 4A, a cross-sectional illustration of a first layer 406 is shown, in accordance with an embodiment. In an embodiment, the first layer 406 may be a dielectric material. The first layer 406 may be formed over underlying substrate layers of a package substrate. In an additional embodiment, the first layer 406 may be formed over a carrier substrate which may be removed after the EMIB is fabricated.

Figure 4B:
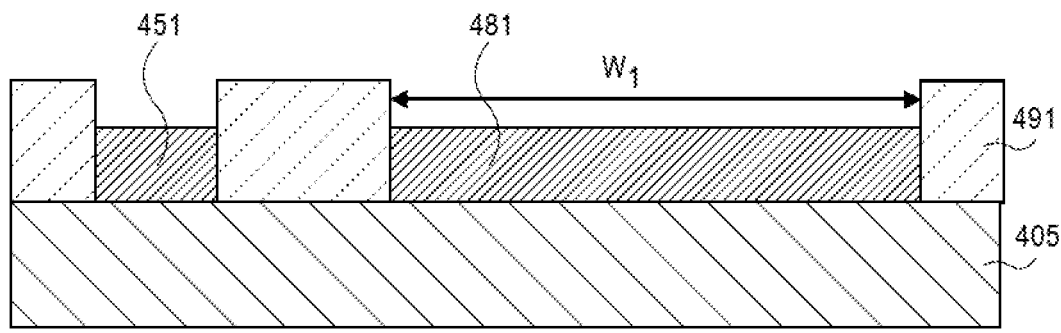
FIG. 4B is a cross-sectional illustration of the first layer after a first conductive layer is formed, in accordance with an embodiment.

Referring now to FIG. 4B, a cross-sectional illustration after the first conductive layer 451 is formed is shown, in accordance with an embodiment. In an embodiment, the first conductive layer 451 may also include a first sacrificial portion 481. In an embodiment, the first conductive layer 451 and the first sacrificial portion 481 may be formed with a lithography process. For example, a first photoresist layer 491 may be formed over the first layer 405 and patterned to form openings where the first conductive layer 451 and the first sacrificial portion 481 are formed. In an embodiment, the first photoresist layer 491 may have an opening with a first width $W_1$ that is substantially equal to the width desired for the first portion of the cavity formed in subsequent processing operation. After the first photoresist 491 is patterned, the first conductive layer and the first sacrificial portion 481 may be formed with a suitable deposition process, such as electrolytic plating.

It is to be appreciated that since the first conductive layer 451 and the first sacrificial portion 481 are formed with a photolithography process the sidewalls of the first conductive layer 451 and the sidewalls of the first sacrificial portion 481 are substantially vertical. Furthermore, it is to be appreciated that since the first conductive layer 451 and the first sacrificial portion 481 are formed with the same deposition process that top surface of the first conductive layer 451 and the top surface of the first sacrificial portion 481 may be substantially coplanar.

Figure 4C:
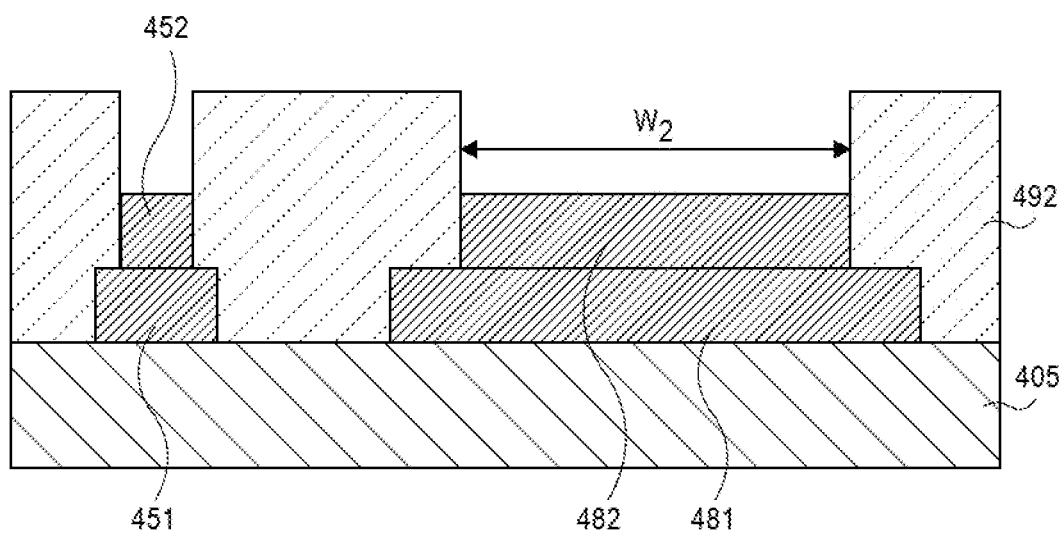
FIG. 4C is a cross-sectional illustration after a second conductive layer is formed, in accordance with an embodiment.

Referring now to FIG. 4C, a cross-sectional illustration after the second conductive layer 452 and the second sacrificial portion 482 are formed is shown, in accordance with an embodiment. In an embodiment, the second conductive layer 452 and the second sacrificial portion 482 may be formed with a lithography process. In an embodiment, the first photoresist layer 491 is stripped and a second photoresist layer 492 is deposited and patterned to form openings for the second conductive layer 452 and the second sacrificial portion 482. In an embodiment, the opening for the second conductive layer 452 is sized to form a pillar over the first conductive layer 451, and the opening for the second sacrificial portion 482 is sized with a width $W_2$. In an embodiment, the width $W_2$ is less than the width $W_1$ in order to account for misalignment between the two layers. After the openings are formed, the second conductive layer 452 and the second sacrificial portion 482 may be deposited with a suitable deposition process, such as electrolytic plating.

It is to be appreciated that since the second conductive layer 452 and the second sacrificial portion 482 are formed with a photolithography process the sidewalls of the second conductive layer 452 and the sidewalls of the second sacrificial portion 482 are substantially vertical. Furthermore, it is to be appreciated that since the second conductive layer 452 and the second sacrificial portion 482 are formed with the same deposition process that top surface of the second conductive layer 452 and the top surface of the second sacrificial portion 482 may be substantially coplanar.

Figure 4D:
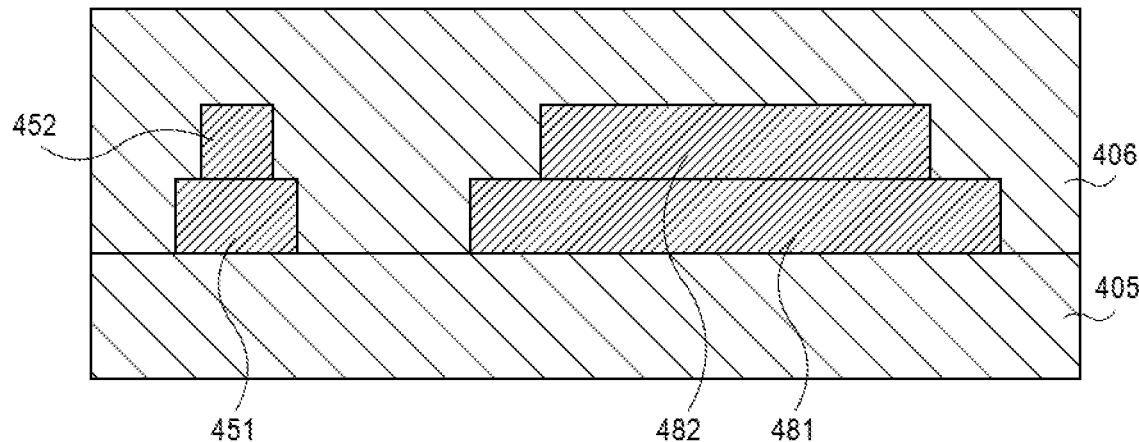
FIG. 4D is a cross-sectional illustration after a second layer is formed over the conductive layers and the first layer, in accordance with an embodiment.

Referring now to FIG. 4D, a cross-sectional illustration after a second layer 406 is formed over the first layer 405 is shown, in accordance with an embodiment. In an embodiment, the second photoresist layer 492 may be stripped and the second layer 406 may be disposed over the exposed surfaces. In an embodiment, the second layer 406 may be laminated over the underlying layers. In an embodiment, the thickness of the second layer may be greater than the combined thickness of the first sacrificial portion 481 and the second sacrificial portion 482.

Figure 4E:
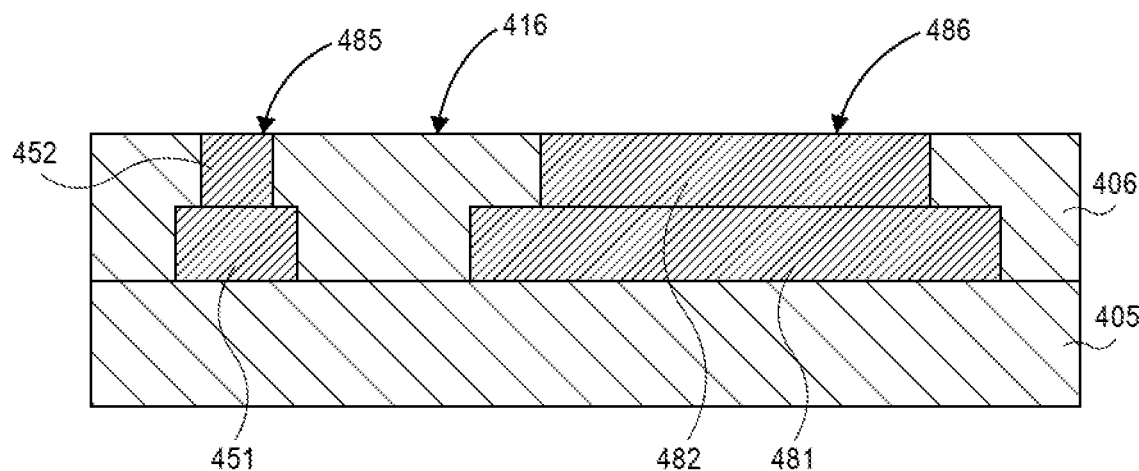
FIG. 4E is a cross-sectional illustration after the second layer is planarized with a top surface of the second conductive layer in accordance with an embodiment.

Referring now to FIG. 4E, a cross-sectional illustration after the second layer 406 is planarized with a top surface 485 of the second conductive layer 451 and a top surface 486 of the second sacrificial portion 482 is shown, in accordance with an embodiment. In an embodiment, the second layer may be planarized with a suitable process, such as chemical mechanical planarization (CMP) or the like. The presence of the second sacrificial portion 482 provides additional surface area (i.e., in addition to the surface area of the second conductive layer) that serves as a stop point for planarizing process. Accordingly, the planarizing process may be more precise as compared to a planarizing process that only uses the pillars of the second metal layer 452 for the stop point. As such, embodiments include top surfaces of the second layer 485, the second sacrificial layer 482, and the second layer 416 that are substantially coplanar with each other.

Figure 4F:
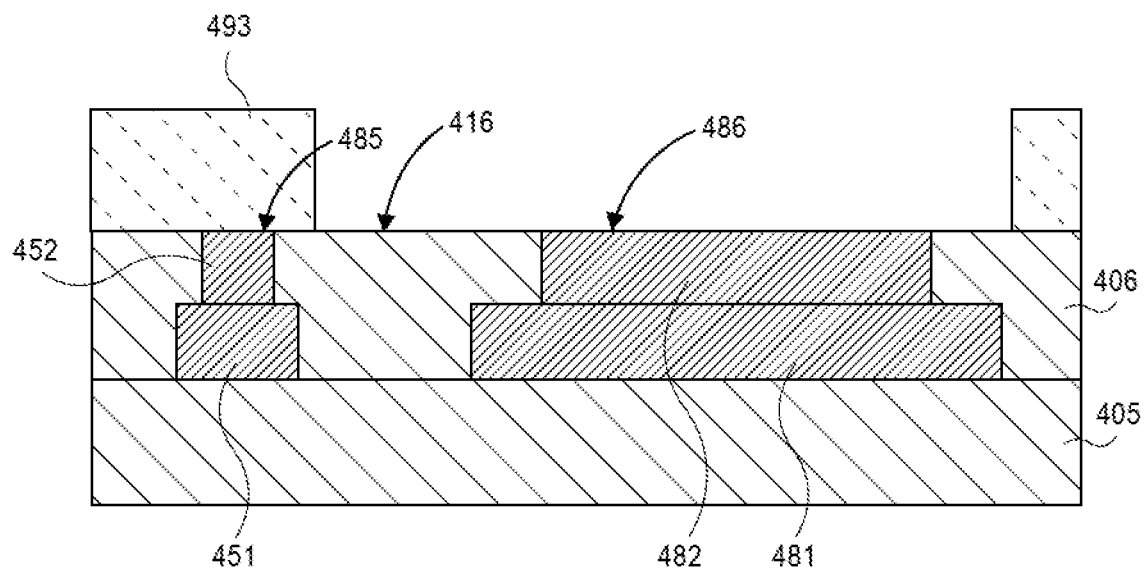
FIG. 4F is a cross-sectional illustration after a mask layer is formed over the second layer that exposes first and second sacrificial portions of the first and second conductive layers, in accordance with an embodiment.

Referring now to FIG. 4F, a cross-sectional illustration after a third photoresist layer 493 is patterned is shown, in accordance with an embodiment. In an embodiment, the third photoresist layer 493 may be formed over the top surface 416 of the second layer 406 and patterned to form an opening over the second sacrificial layer 482.

Figure 4G:
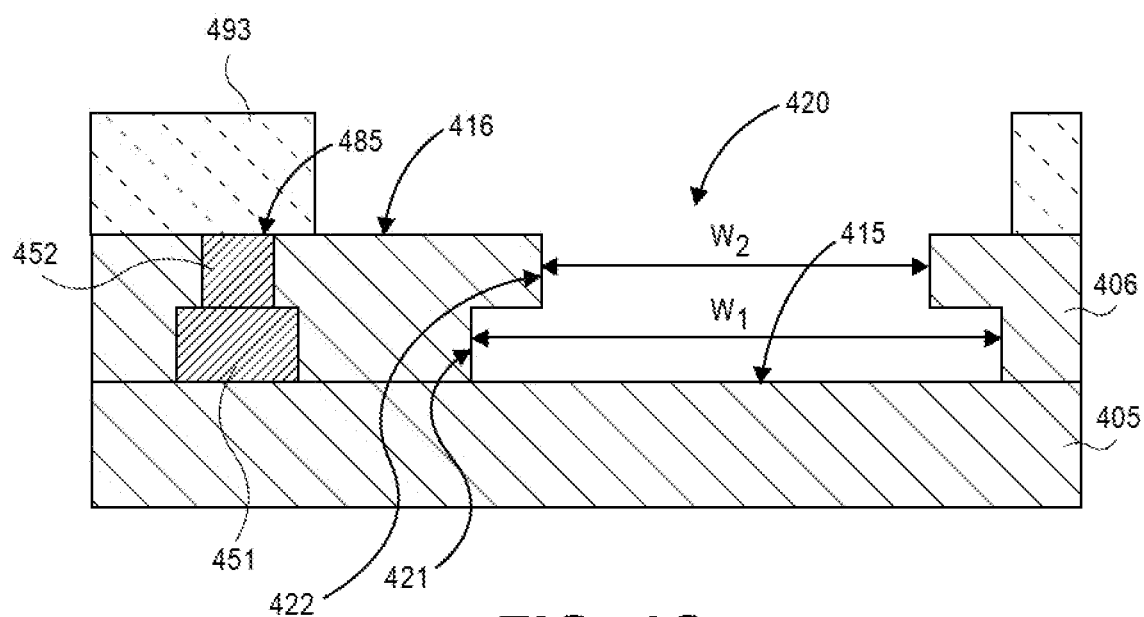
FIG. 4G is a cross-sectional illustration after the first and second sacrificial portions are removed to form a cavity, in accordance with an embodiment.

Referring now to FIG. 4G, a cross-sectional illustration after the first sacrificial portion 481 and the second sacrificial portion 482 are removed to form a cavity 420 is shown, in accordance with an embodiment. In an embodiment, the sacrificial portions 481 and 482 may be removed with an etching processes. For example a wet etching process may be used. The use of an etching process allows for the complete removal of the sacrificial portions 481 and 482 without substantially altering the dimensions of the cavity 420. As such, the dimensions of the cavity 420 may be precisely controlled compared to the use of a laser skiving needed in the current process used to form cavities. In an embodiment, the cavity 420 may include a first portion 421 that corresponds to the location of the first sacrificial portion 481 and a second portion 422 that corresponds to the second sacrificial portion 482. As such, the first portion 421 of the cavity 420 may have a width $W_1$ and the second portion 422 of the cavity 420 may have a width $W_2$. In an embodiment, the cavity 420 is formed completely through the second layer 406 and exposes a top surface 415 of the first layer 405.

Figure 4H:
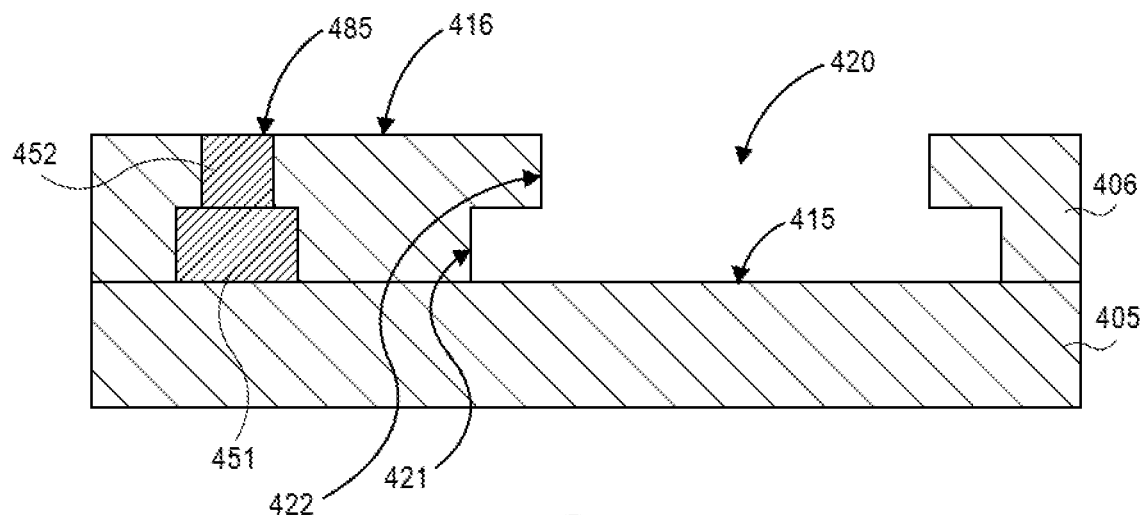
FIG. 4H is a cross-sectional illustration after the mask layer is removed, in accordance with an embodiment.

Referring now to FIG. 4H, a cross-sectional illustration after the third photoresist 493 is removed is shown, in accordance with an embodiment. In an embodiment, the third photoresist 493 may be removed with any suitable processing operation, such as stripping.

Figure 4I:
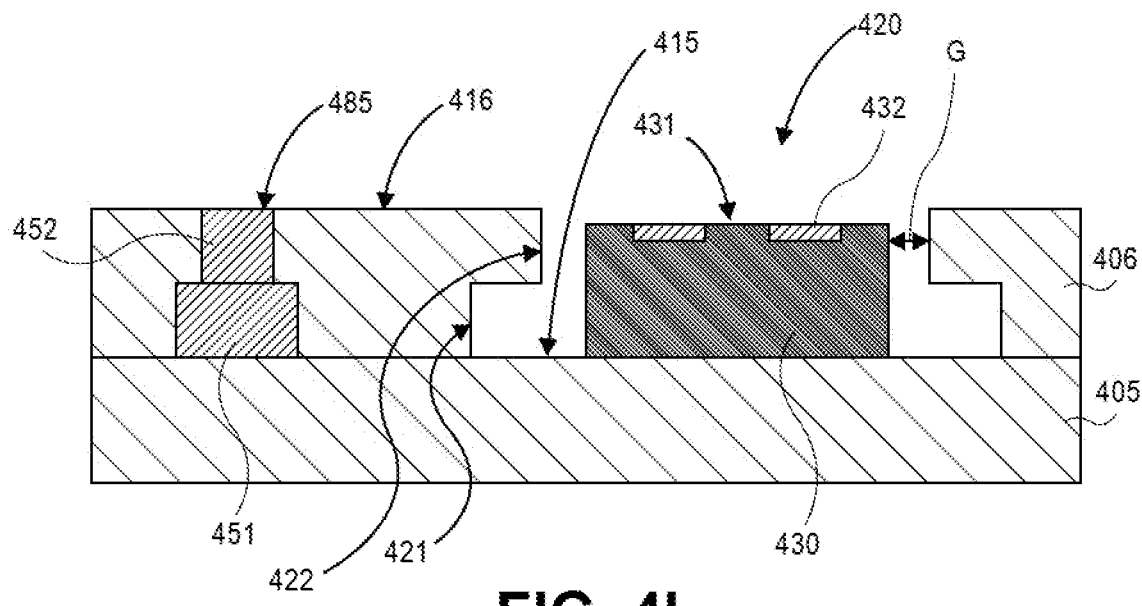
FIG. 4I is a cross-sectional illustration after a bridge substrate is mounted in the cavity, in accordance with an embodiment.

Referring now to FIG. 4I, a cross-sectional illustration after a bridge substrate 430 is mounted in the cavity 420 is shown, in accordance with an embodiment. In an embodiment, the bridge substrate 430 may be mounted in the cavity 420 and supported by the first layer 405. In some embodiments, the bridge substrate 430 may be secured to the first layer 405 by an adhesive (not shown), such as a DBF. In an embodiment, the bridge substrate 430 may be separated from a sidewall of the second portion 422 of the cavity 420 by a gap G. The gap G may be sufficiently large to allow for a third layer to fill the remaining portion of the cavity 420, as will be described in greater detail below.

Figure 4J:
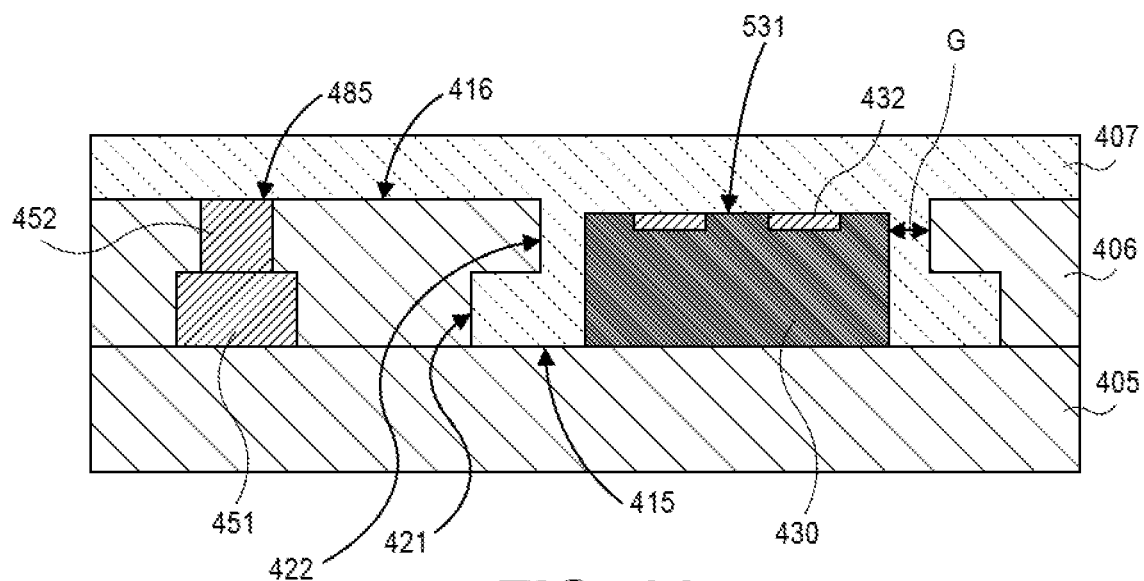
FIG. 4J is a cross-sectional illustration after a third layer is formed over the second layer and into the cavity, in accordance with an embodiment.

Referring now to FIG. 4J, a cross-sectional illustration after a third layer 407 is formed over the exposed surfaces is shown, in accordance with an embodiment. In an embodiment, the third layer 407 may be disposed over the surfaces with any suitable process. For example, the third layer 407 may be laminated over the exposed surfaces. In an embodiment, the third layer 407 may fill the remaining portions of the cavity 420, including the entire first portion 421.

Figure 4K:
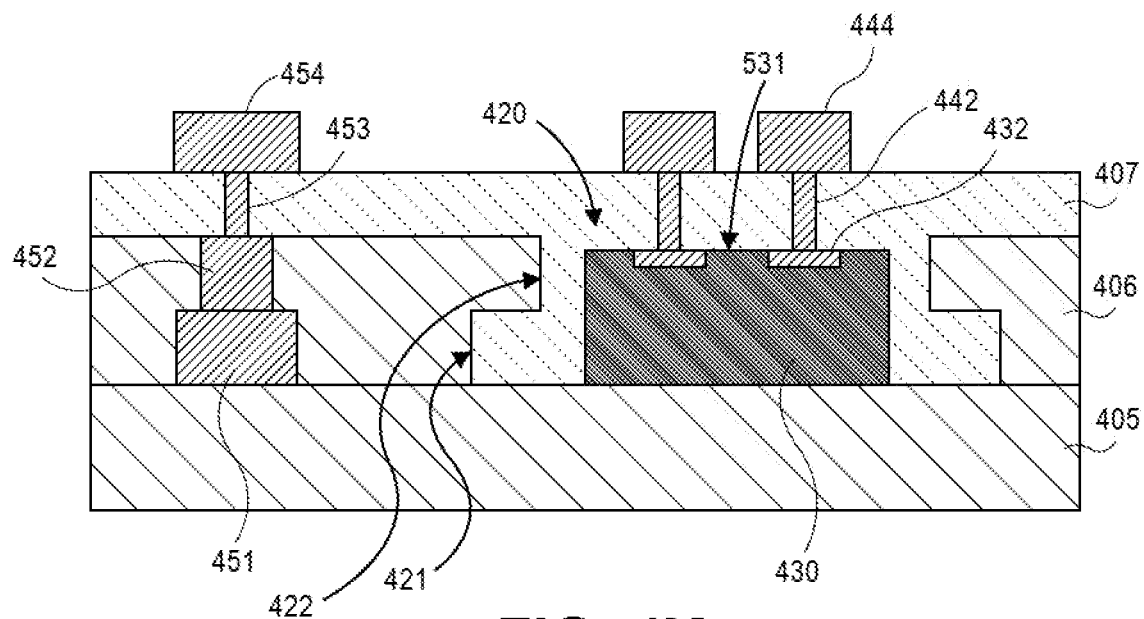
FIG. 4K is a cross-sectional illustration after vias are formed through the third layer, in accordance with an embodiment.

Referring now to FIG. 4K, a cross-sectional illustration after vias 442, 453 and pads 444 and 454 are formed is shown, in accordance with an embodiment. In an embodiment, the vias 442 may be formed into the third layer 407 to electrically couple pads 444 to contact pads 432 on the bridge substrate 430. Similarly, vias 453 may be formed into the third layer 407 to electrically couple pads 454 to the second conductive layer 452. In an embodiment, the vias and pads may be formed with any suitable process, such as laser drilling and/or photolithography processes.

Figure 5A:
FIG. 5A is a cross-sectional illustration of a first layer, in accordance with an embodiment.

Referring now to FIGS. 5A-5K, a series of cross-sectional illustrations showing a process for forming an EMIB with a self-aligned via process is shown, in accordance with an embodiment. Referring now to FIG. 5A, a cross-sectional illustration of a first layer 506 is shown, in accordance with an embodiment. In an embodiment, the first layer 506 may be a dielectric material. The first layer 506 may be formed over underlying substrate layers of a package substrate. In an additional embodiment, the first layer 506 may be formed over a carrier substrate which may be removed after the EMIB is fabricated.

Figure 5B:
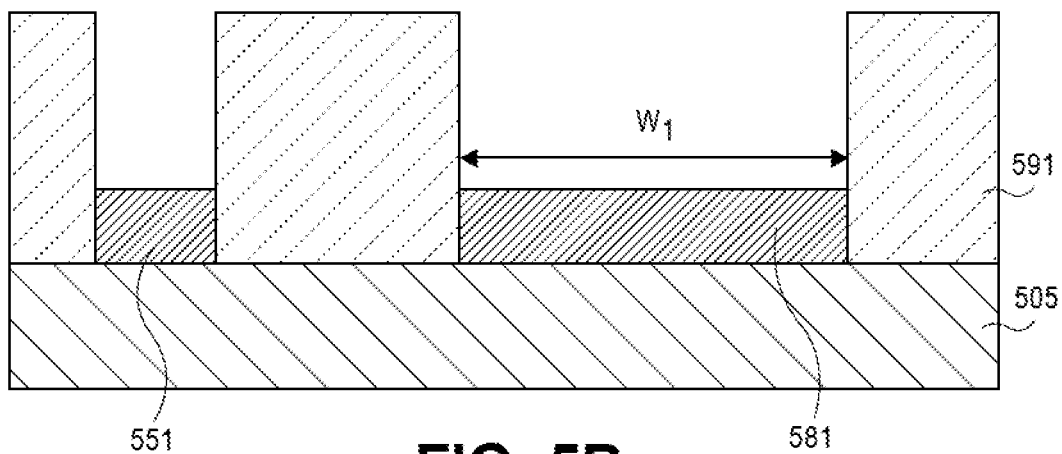
FIG. 5B is a cross-sectional illustration of the first layer after a first conductive layer is formed, in accordance with an embodiment.

Referring now to FIG. 5B, a cross-sectional illustration after the first conductive layer 551 is formed is shown, in accordance with an embodiment. In an embodiment, the first conductive layer 551 may also include a first sacrificial portion 581. In an embodiment, the first conductive layer 551 and the first sacrificial portion 581 may be formed with a lithography process. For example, a first photoresist layer 591 may be formed over the first layer 505 and patterned to form openings where the first conductive layer 551 and the first sacrificial portion 581 are formed. In an embodiment, the first photoresist layer 591 may have an opening with a first width $W_1$ that is substantially equal to the width desired for the first portion of the cavity formed in subsequent processing operation. After the first photoresist 591 is patterned, the first conductive layer and the first sacrificial portion 581 may be formed with a suitable deposition process, such as electrolytic plating.

In the self-aligned via process described with respect to this process flow, it is to be appreciated that the thickness of the first photoresist layer 591 needs to be sufficient to allow for the formation of the first conductive layer and the second conductive layer. As noted above the increased thickness of the first photoresist layer 591 may result in lower resolution. However, such embodiments allow for the elimination of the overhang present in the processing flow previously described. The improvement in the reliability attributable to easier filling of the cavity with the third layer is a positive advantage.

It is to be appreciated that since the first conductive layer 551 and the first sacrificial portion 581 are formed with a photolithography process the sidewalls of the first conductive layer 551 and the sidewalls of the first sacrificial portion 581 are substantially vertical. Furthermore, it is to be appreciated that since the first conductive layer 551 and the first sacrificial portion 581 are formed with the same deposition process that top surface of the first conductive layer 551 and the top surface of the first sacrificial portion 581 may be substantially coplanar.

Figure 5C:
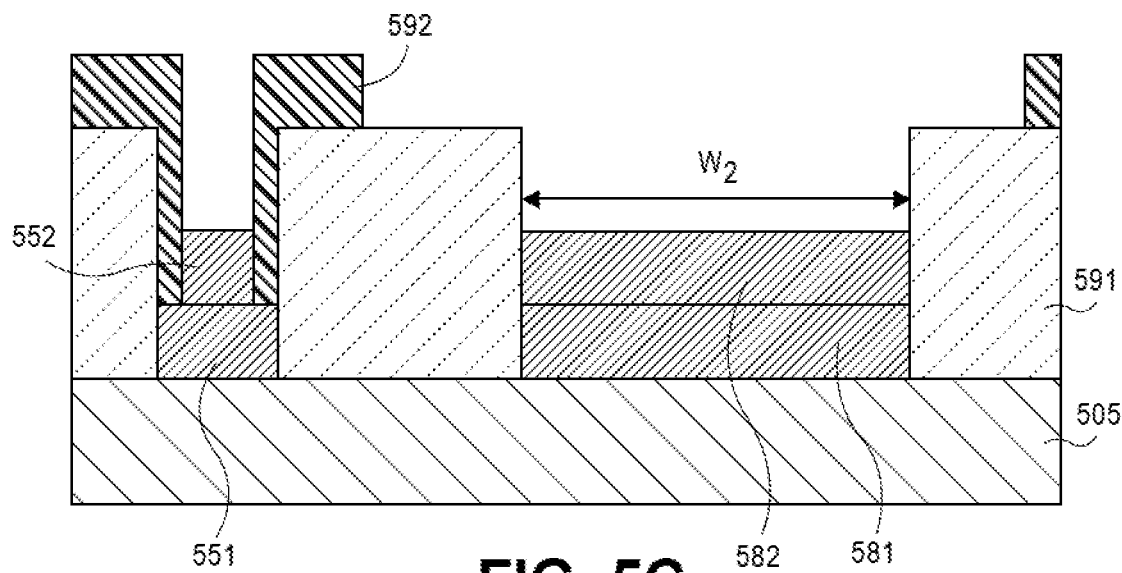
FIG. 5C is a cross-sectional illustration after a second conductive layer is formed, in accordance with an embodiment.

Referring now to FIG. 5C, a cross-sectional illustration after the second conductive layer 552 and the second sacrificial portion 582 are formed is shown, in accordance with an embodiment. In an embodiment, the second conductive layer 552 and the second sacrificial portion 582 may be formed with a self-aligned lithography process. In an embodiment, the first photoresist layer 591 remains and a second photoresist layer 592 is deposited over the first photoresist layer 591 and patterned to form openings for the second conductive layer 552 and to completely expose the opening in the first photoresist layer 591 in order to form a self-aligned second sacrificial portion 582. In an embodiment, the opening for the second conductive layer 552 is sized to form a pillar over the first conductive layer 551. Since the opening in the first photoresist layer 591 is used again to form the second sacrificial portion 582, the second sacrificial portion includes a width $W_2$ that is substantially equal to $W_1$. After the openings are formed, the second conductive layer 552 and the second sacrificial portion 582 may be deposited with a suitable deposition process, such as electrolytic plating.

It is to be appreciated that since the second conductive layer 552 and the second sacrificial portion 582 are formed with a photolithography process the sidewalls of the second conductive layer 552 and the sidewalls of the second sacrificial portion 582 are substantially vertical. Furthermore, it is to be appreciated that since the second conductive layer 552 and the second sacrificial portion 582 are formed with the same deposition process that top surface of the second conductive layer 552 and the top surface of the second sacrificial portion 582 may be substantially coplanar.

Figure 5D:
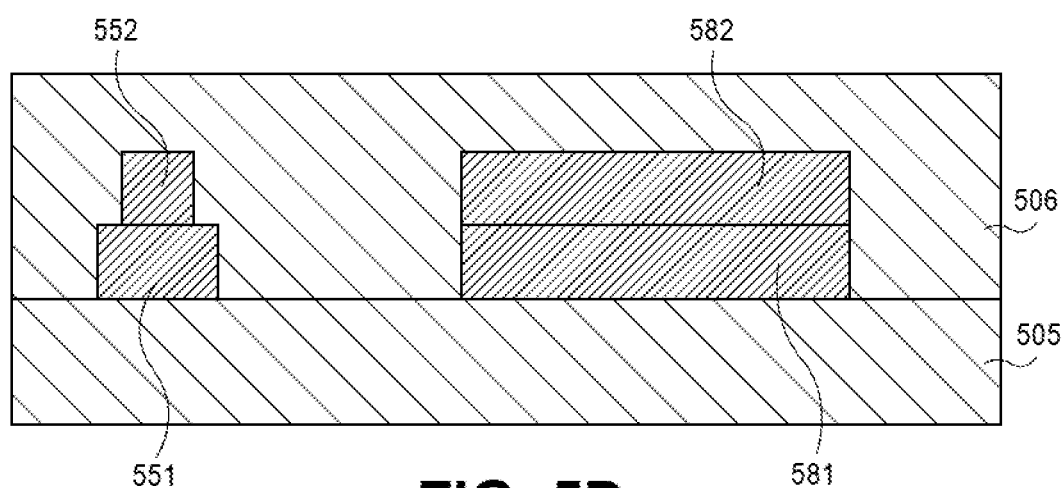
FIG. 5D is a cross-sectional illustration after a second layer is formed over the conductive layers and the first layer, in accordance with an embodiment.

Referring now to FIG. 5D, a cross-sectional illustration after a second layer 506 is formed over the first layer 505 is shown, in accordance with an embodiment. In an embodiment, the first photoresist layer 591 and second photoresist layer 592 may be stripped and the second layer 506 may be disposed over the exposed surfaces. In an embodiment, the second layer 506 may be laminated over the underlying layers. In an embodiment, the thickness of the second layer may be greater than the combined thickness of the first sacrificial portion 581 and the second sacrificial portion 582.

Figure 5E:
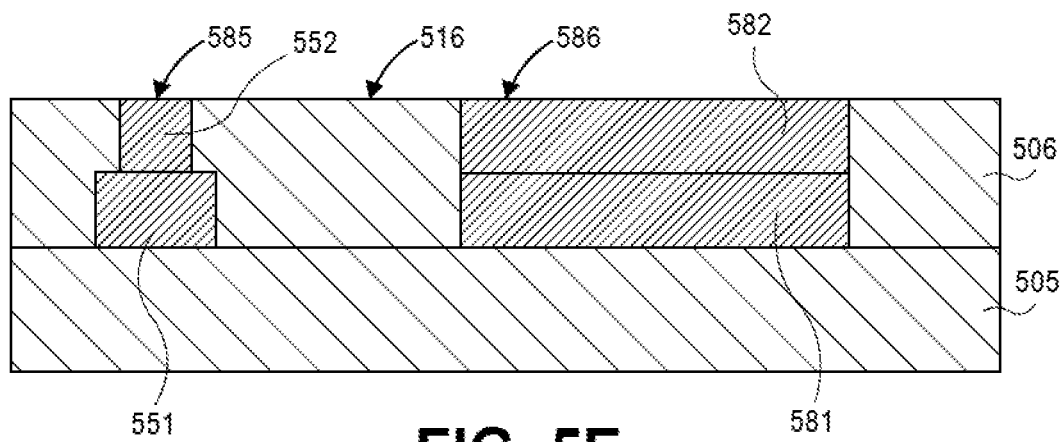
FIG. 5E is a cross-sectional illustration after the second layer is planarized with a top surface of the second conductive layer in accordance with an embodiment.

Referring now to FIG. 5E, a cross-sectional illustration after the second layer 506 is planarized with a top surface 585 of the second conductive layer 551 and a top surface 586 of the second sacrificial portion 582 is shown, in accordance with an embodiment. In an embodiment, the second layer may be planarized with a suitable process, such as chemical mechanical planarization (CMP) or the like. The presence of the second sacrificial portion 582 provides additional surface area (i.e., in addition to the surface area of the second conductive layer) that serves as a stop point for planarizing process. Accordingly, the planarizing process may be more precise as compared to a planarizing process that only uses the pillars of the second metal layer 552 for the stop point. As such, embodiments include top surfaces of the second layer 585, the second sacrificial layer 582, and the second layer 416 that are substantially coplanar with each other.

Figure 5F:
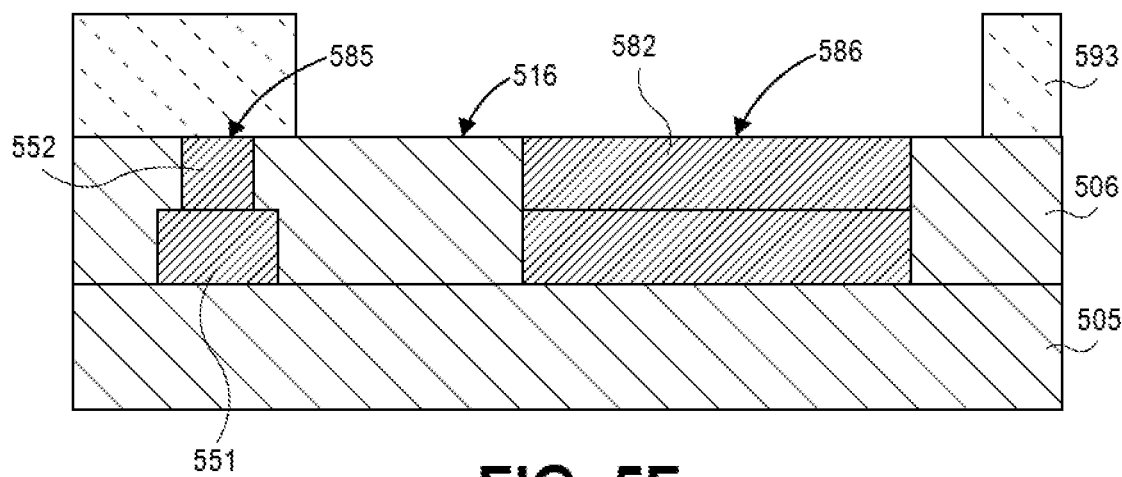
FIG. 5F is a cross-sectional illustration after a mask layer is formed over the second layer that exposes first and second sacrificial portions of the first and second conductive layers, in accordance with an embodiment.

Referring now to FIG. 5F, a cross-sectional illustration after a third photoresist layer 593 is patterned is shown, in accordance with an embodiment. In an embodiment, the third photoresist layer 593 may be formed over the top surface 516 of the second layer 506 and patterned to form an opening over the second sacrificial layer 582.

Figure 5G:
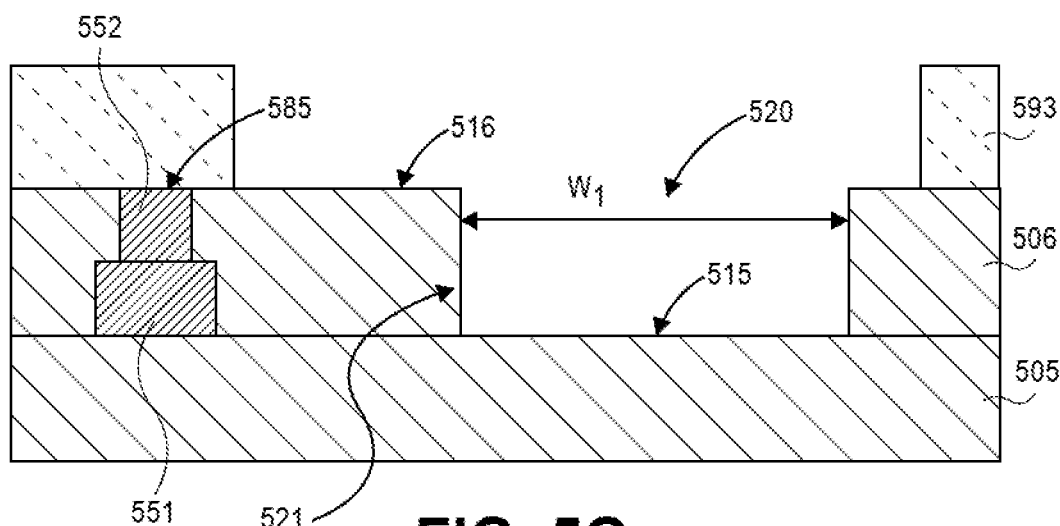
FIG. 5G is a cross-sectional illustration after the first and second sacrificial portions are removed to form a cavity, in accordance with an embodiment.

Referring now to FIG. 5G, a cross-sectional illustration after the first sacrificial portion 581 and the second sacrificial portion 582 are removed to form a cavity 520 is shown, in accordance with an embodiment. In an embodiment, the sacrificial portions 581 and 582 may be removed with an etching processes. For example a wet etching process may be used. The use of an etching process allows for the complete removal of the sacrificial portions 581 and 582 without substantially altering the dimensions of the cavity 520. As such, the dimensions of the cavity 520 may be precisely controlled compared to the use of a laser skiving needed in the current process used to form cavities. In an embodiment, the cavity 520 may include a first portion 521 that corresponds to the locations of the first sacrificial portion 581 and the second sacrificial portion 582. As such, the first portion 521 of the cavity 520 may have a width $W_1$. In an embodiment, the cavity 520 is formed completely through the second layer 506 and exposes a top surface 515 of the first layer 505.

Figure 5H:
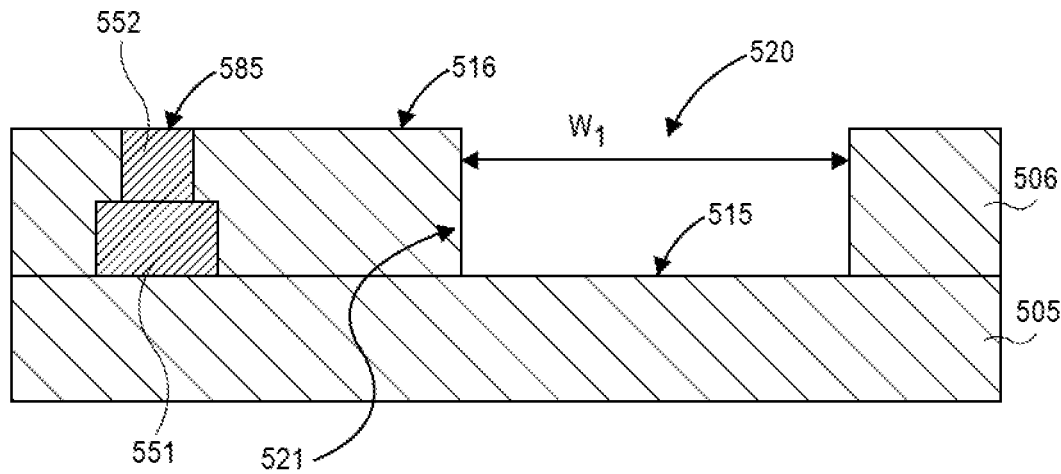
FIG. 5H is a cross-sectional illustration after the mask layer is removed, in accordance with an embodiment.

Referring now to FIG. 5H, a cross-sectional illustration after the third photoresist 593 is removed is shown, in accordance with an embodiment. In an embodiment, the third photoresist 593 may be removed with any suitable processing operation, such as stripping.

Figure 5I:
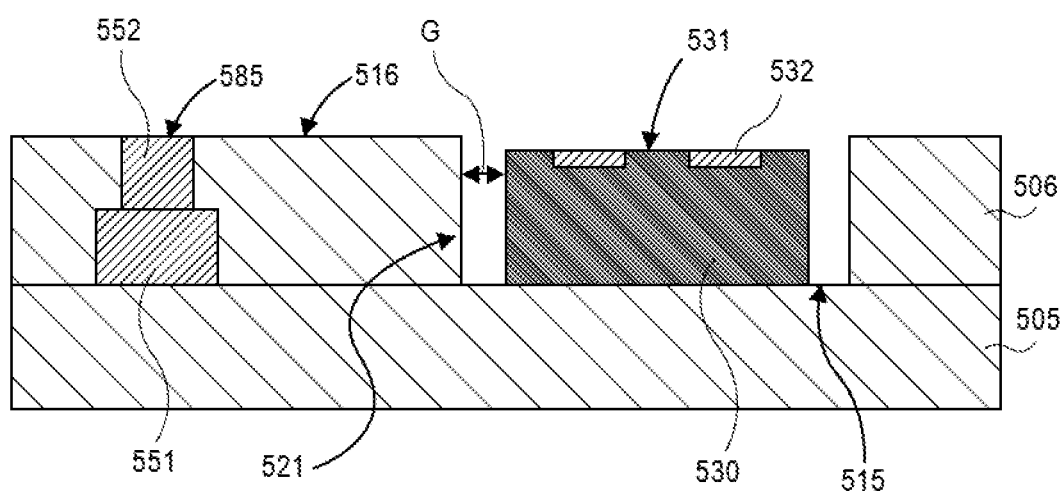
FIG. 5I is a cross-sectional illustration after a bridge substrate is mounted in the cavity, in accordance with an embodiment.

Referring now to FIG. 5I, a cross-sectional illustration after a bridge substrate 530 is mounted in the cavity 520 is shown, in accordance with an embodiment. In an embodiment, the bridge substrate 530 may be mounted in the cavity 520 and supported by the first layer 505. In some embodiments, the bridge substrate 530 may be secured to the first layer 505 by an adhesive (not shown), such as a DBF. In an embodiment, the bridge substrate 530 may be separated from a sidewall of the second portion 522 of the cavity 520 by a gap G. The gap G may be sufficiently large to allow for a third layer to fill the remaining portion of the cavity 520, as will be described in greater detail below.

Figure 5J:
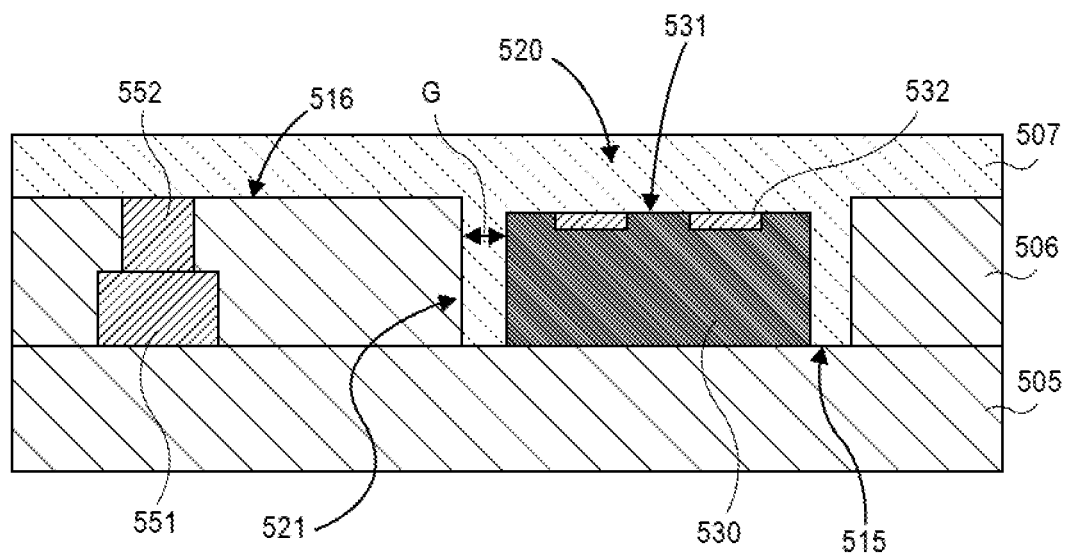
FIG. 5J is a cross-sectional illustration after a third layer is formed over the second layer and into the cavity, in accordance with an embodiment.

Referring now to FIG. 5J, a cross-sectional illustration after a third layer 507 is formed over the exposed surfaces is shown, in accordance with an embodiment. In an embodiment, the third layer 507 may be disposed over the surfaces with any suitable process. For example, the third layer 507 may be laminated over the exposed surfaces. In an embodiment, the third layer 507 may fill the remaining portions of the cavity 520. It is to be appreciated that the lack of the overhang that is present in other embodiments results in easier manufacturability since it is easier to completely fill the remaining portions of the cavity 520.

Figure 5K:
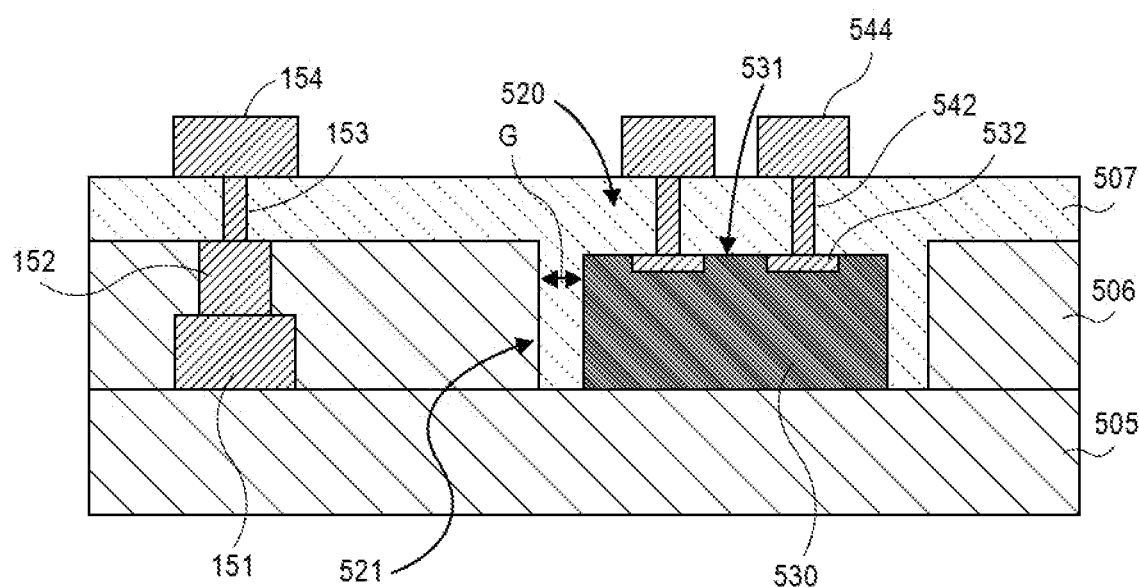
FIG. 5K is a cross-sectional illustration after vias are formed through the third layer, in accordance with an embodiment.

Referring now to FIG. 5K, a cross-sectional illustration after vias 542, 553 and pads 544 and 554 are formed is shown, in accordance with an embodiment. In an embodiment, the vias 542 may be formed into the third layer 507 to electrically couple pads 544 to contact pads 532 on the bridge substrate 530. Similarly, vias 553 may be formed into the third layer 507 to electrically couple pads 554 to the second conductive layer 552. In an embodiment, the vias and pads may be formed with any suitable process, such as laser drilling and/or photolithography processes.

Figure 6:
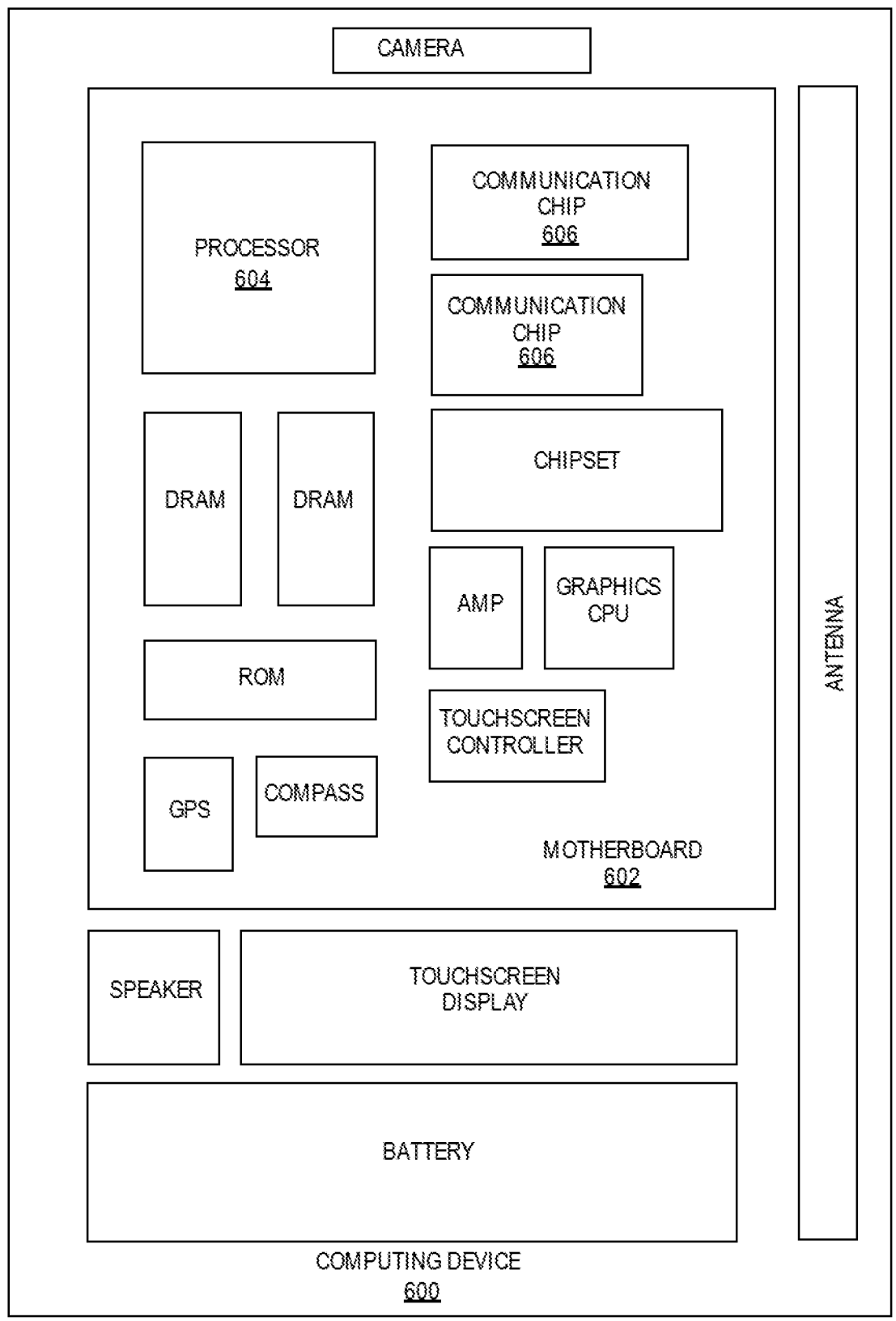
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be communicatively coupled to a memory die or any other type of die with an EMIB, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be communicatively coupled to a memory die or any other type of die with an EMIB, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 includes an electronic package, comprising: a first layer, wherein the first layer comprises an organic material; a second layer disposed over the first layer, wherein the second layer comprises an organic material; a cavity through the second layer to expose a first surface of the first layer; and a bridge substrate in the cavity, wherein the bridge substrate is supported by the first surface of the first layer.

Example 2 includes the electronic package of Example 1, wherein the cavity includes a first portion and a second portion above the first portion, wherein a width of the first portion is greater than a width of the second portion.

Example 3 includes the electronic package of Example 1 or Example 2, wherein a height of the first portion of the cavity is equal to a height of a first conductive layer over the first layer.

Example 4 includes the electronic package of Example 1-3, wherein a height of the second portion of the cavity is equal to a height of a pillar over the first conductive layer.

Example 5 includes the electronic package of Example 1-4, wherein a sidewall surface of the first portion of the cavity and a sidewall surface of the second portion of the cavity are substantially vertical.

Example 6 includes the electronic package of Example 1-5, wherein the die is attached to the first surface of the first layer by an adhesive.

Example 7 includes the electronic package of Example 1-6, further comprising: a third layer, wherein the third layer fills the cavity and is over the second layer.

Example 8 includes the electronic package of Example 1-7, wherein the third layer conforms to sidewall surfaces of the cavity.

Example 9 includes the electronic package of Example 1-8, further comprising: a conductive layer over the third layer, wherein the conductive layer is electrically coupled to a contact pad on the bridge substrate with a via through a portion of the third layer.

Example 10 includes the electronic package of Example 1-9, wherein a top surface of the second layer is above a top surface of the die.

Example 11 includes an electronic package, comprising: a first layer, wherein the first layer comprises an organic material; a second layer disposed over the first layer, wherein the second layer comprises an organic material; a cavity through the second layer to expose a first surface of the first layer; a bridge substrate in the cavity, wherein the die is supported by the first surface of the first layer, wherein the bridge substrate includes a first contact and a second contact; a first die over the second layer, wherein the first die comprises a contact pad that is electrically coupled to the first contact on the bridge substrate; and a second die over the second layer, wherein the second die comprises a contact pad that is electrically coupled to the second contact on the bridge substrate, and wherein the first die is electrically coupled to the second die by the bridge substrate.

Example 12 includes the electronic package of Example 11, wherein the first die is a logic die and the second die is a memory die.

Example 13 includes the electronic package of Example 11 or 12, wherein the first contact on the bridge substrate is electrically coupled to the second contact on the bridge substrate by conductive traces.

Example 14 include the electrical package of Example 11-13, wherein conductive traces include a line/space dimension of 2 μm/2 μm.

Example 15 include the electrical package of Example 11-14, wherein the first die and the second die comprise a fine bump pitch region, wherein the fine bump pitch regions are electrically coupled to the bridge substrate by solder bumps.

Example 16 include the electrical package of Example 11-15, wherein the pitch of the solder bumps in the fine bump pitch region is 55 μm or less.

Example 17 include the electrical package of Example 11-16, wherein the pitch of the solder bumps in the fine bump pitch region is 30 μm or less.

Example 18 include the electrical package of Example 11-17, wherein the cavity includes a first portion and a second portion above the first portion, wherein a width of the first portion is greater than a width of the second portion.

Example 19 include the electrical package of Example 11-18, wherein a height of the first portion of the cavity is equal to a height of a first conductive layer over the first layer, and wherein a height of the second portion of the cavity is equal to a height of a pillar over the first conductive layer.

Example 20 include the electrical package of Example 11-19, wherein a sidewall surface of the first portion of the cavity and a sidewall surface of the second portion of the cavity are substantially vertical.

Example 21 includes a method of forming an electronic package, comprising: forming a first conductive layer over a first layer with a first lithography process, wherein the first layer is an organic material; forming a second conductive layer over the first conductive layer with a second lithography process; forming a second layer over the first conductive layer and the second conductive layer; planarizing a top surface of the second layer with a top surface of the second conductive layer; removing portions of the first conductive layer and portions of the second conductive layer with an etching process, wherein the removal of portions of the first conductive layer and portions of the second conductive layer forms a cavity in the second layer and exposes a portion of the first layer; and mounting a bridge substrate in the cavity.

Example 22 includes the method of Example 21, wherein forming the first conductive layer includes forming a first sacrificial portion and a first conductive pad, and wherein forming the second conductive layer includes forming a second sacrificial portion and a conductive pillar, and wherein the first sacrificial portion and the second sacrificial portion are the portions of the first conductive layer and the portions of the second conductive layer that are removed.

Example 23 includes the method of Example 21 or 22, wherein a width of the first sacrificial portion of the first conductive layer is greater than a width of the second sacrificial portion of the second conductive layer.

Example 24 includes the method of Example 21-23, wherein the sidewalls of the cavity are substantially vertical.

Example 25 includes the method of Example 21-24, further comprising: forming a third layer over the second layer and the first layer, wherein the third layer fills the cavity and is formed along sidewalls of the bridge substrate and over a top surface of the bridge substrate.

What is claimed is:

1. An electronic package, comprising:
   a first layer, wherein the first layer comprises an organic material;
   a second layer disposed over the first layer, wherein the second layer comprises an organic material;
   a cavity through the second layer to expose a first surface of the first layer; and
   a bridge substrate in the cavity, wherein the bridge substrate is supported by and in contact with the first surface of the first layer, and wherein the bridge substrate is laterally spaced apart from the second layer.

2. The electronic package of claim 1, wherein the cavity includes a first portion and a second portion above the first portion, wherein a width of the first portion is greater than a width of the second portion.

3. The electronic package of claim 2, wherein a height of the first portion of the cavity is equal to a height of a first conductive layer over the first layer.

4. The electronic package of claim 3, wherein a height of the second portion of the cavity is equal to a height of a pillar over the first conductive layer.

5. The electronic package of claim 2, wherein a sidewall surface of the first portion of the cavity and a sidewall surface of the second portion of the cavity are substantially vertical.

6. The electronic package of claim 1, further comprising:
   a third layer, wherein the third layer fills the cavity and is over the second layer.

7. The electronic package of claim 6, wherein the third layer conforms to sidewall surfaces of the cavity.

8. The electronic package of claim 7, further comprising:
   a conductive layer over the third layer, wherein the conductive layer is electrically coupled to a contact pad on the bridge substrate with a via through a portion of the third layer.

9. The electronic package of claim 1, wherein a top surface of the second layer is above a top surface of the bridge substrate.

10. An electronic package, comprising:
    a first layer, wherein the first layer comprises an organic material;
    a second layer disposed over the first layer, wherein the second layer comprises an organic material;
    a cavity through the second layer to expose a first surface of the first layer, wherein the cavity includes a first portion and a second portion above the first portion, wherein a width of the first portion is greater than a width of the second portion; and
    a bridge substrate in the cavity, wherein the bridge substrate is supported by the first surface of the first layer.

11. The electronic package of claim 10, wherein a height of the first portion of the cavity is equal to a height of a first conductive layer over the first layer.

12. The electronic package of claim 11, wherein a height of the second portion of the cavity is equal to a height of a pillar over the first conductive layer.

13. The electronic package of claim 10, wherein a sidewall surface of the first portion of the cavity and a sidewall surface of the second portion of the cavity are substantially vertical.

14. An electronic package, comprising:
    a first layer, wherein the first layer comprises an organic material;
    a second layer disposed over the first layer, wherein the second layer comprises an organic material;
    a cavity through the second layer to expose a first surface of the first layer;
    a bridge substrate in the cavity, wherein the bridge substrate is supported by the first surface of the first layer; and
    a third layer, wherein the third layer fills the cavity and is over the second layer.

15. The electronic package of claim 14, wherein the third layer conforms to sidewall surfaces of the cavity.

16. The electronic package of claim 14, further comprising:
    a conductive layer over the third layer, wherein the conductive layer is electrically coupled to a contact pad on the bridge substrate with a via through a portion of the third layer.

* * * * *